US012518950B2

(12) United States Patent
Siry et al.

(10) Patent No.: US 12,518,950 B2

(45) Date of Patent: Jan. 6, 2026

(54) GAS FLOW GUIDE DESIGN FOR PLASMA SUPPRESSION

(71) Applicant: Applied Materials, Inc., Santa Clara, CA (US)

(72) Inventors: Milan Siry, Santa Clara, CA (US); Michael Liang, Santa Clara, CA (US); Jeffrey A. Kho, Monte Sereno, CA (US); Kwang Soo Huh, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 594 days.

(21) Appl. No.: 17/903,847

(22) Filed: Sep. 6, 2022

(65) Prior Publication Data

US 2023/0077652 A1 Mar. 16, 2023

Related U.S. Application Data

(60) Provisional application No. 63/243,819, filed on Sep. 14, 2021.

(51) Int. Cl.

*H01J 37/32* (2006.01)
*C23C 16/455* (2006.01)
*C23C 16/56* (2006.01)

(52) U.S. Cl.

CPC .. *H01J 37/32449* (2013.01); *C23C 16/45536* (2013.01); *C23C 16/45544* (2013.01); *C23C 16/56* (2013.01); *H01J 2237/3321* (2013.01)

(58) Field of Classification Search

CPC ........ H01J 37/32449; H01J 2237/3321; C23C 16/45536; C23C 16/45544; C23C 16/56; C23C 16/403; C23C 16/4401; C23C 16/45504; C23C 16/45578

USPC ..... 118/723 E, 723 ER; 156/345.43, 345.44, 156/345.45

See application file for complete search history.

(56) References Cited

U.S. PATENT DOCUMENTS 4,859,908 A * 8/1989 Yoshida .................. C30B 31/22 315/111.41
4,976,996 A * 12/1990 Monkowski ...... C23C 16/45504 118/725
4,993,360 A * 2/1991 Nakamura ........ C23C 16/45591 239/592

(Continued)

FOREIGN PATENT DOCUMENTS

CN 106337169 B 12/2019
KR 20140033911 A 3/2014

(Continued)

OTHER PUBLICATIONS

PCT/US2022/042651, International Search Report and Written Opinion dated May 12, 2023, 10 pages.

*Primary Examiner* — Rudy Zervigon

(74) *Attorney, Agent, or Firm* — Patterson + Sheridan, LLP

(57) ABSTRACT

Embodiments described herein provide a chamber having a gas flow inlet guide to uniformly deliver process gas. The gas flow inlet guide having a flow guide bottom plate having an opening. A top plate is disposed over the flow guide bottom plate and a plasma blocker is disposed over the opening. The plasma blocker includes one or more apertures sized based one or more of a plasma density, an electron temperature, an ion temperature, or a characteristic of a process gas.

14 Claims, 5 Drawing Sheets

(56) References Cited

U.S. PATENT DOCUMENTS

| | | | | |
|---|---|---|---|---|
| 5,270,616 | A * | 12/1993 | Itatani | H01J 37/32623<br>315/111.21 |
| 5,279,669 | A * | 1/1994 | Lee | B01J 19/126<br>118/723 MR |
| 5,551,982 | A * | 9/1996 | Anderson | C30B 25/14<br>118/725 |
| 2007/0264443 | A1 | 11/2007 | Choi et al. | |
| 2009/0320756 | A1 * | 12/2009 | Tanaka | H01J 37/32697<br>118/723 MW |
| 2020/0017971 | A1 * | 1/2020 | Kao | C23C 16/45544 |
| 2021/0035785 | A1 | 2/2021 | Jeong et al. | |

FOREIGN PATENT DOCUMENTS

| | | | |
|---|---|---|---|
| KR | 101893693 | B1 | 8/2018 |
| WO | 2009075731 | A1 | 6/2009 |

* cited by examiner

GAS FLOW GUIDE DESIGN FOR PLASMA SUPPRESSION

CROSS-REFERENCE TO RELATED APPLICATIONS

This application claims priority to U.S. Provisional Patent Application Ser. No. 63/243,819, filed on Sep. 14, 2021, which is herein incorporated by reference.

BACKGROUND

Field

Embodiments of the present disclosure generally relate to a gas flow guide design for process chambers. More particularly, embodiments of the present disclosure relate to gas flow guides for uniformly delivering process gas and effectively processing substrates with minimal defects.

Description of the Related Art

Gas distribution assemblies are employed for a number of process chambers such as atomic layer deposition (ALD) chambers, or plasma enhanced CVD (PECVD) chambers to provide uniform deposition of materials over substrates. Parasitic plasma from a plasma source or from a process volume of the process chamber can penetrate gas distribution assemblies and cause deposition therein. The deposition forms particles that can contaminate or cause defects in substrates overtime.

Accordingly, what is needed in the art is a chamber having a gas distribution assembly that uniformly delivers process gas and prevents parasitic plasma penetrating therein.

SUMMARY

In one embodiment, a gas flow inlet guide comprises a flow guide bottom plate comprising a first opening and a second opening, the second opening including a plasma blocker disposed thereover; a top plate disposed over and in contact with the flow guide bottom plate to define a plenum; and a plurality of flow guides disposed within the plenum to direct gases from the first opening to the second opening.

In another embodiment, a gas flow inlet guide comprises a flow guide bottom plate comprising a first opening and a second opening, the second opening including a plasma blocker disposed thereover; a top plate disposed over and in contact with the flow guide bottom plate to define a plenum; a flow guide modulator disposed within the plenum between the first opening and the second opening; and a plurality of flow guides disposed within the plenum to direct gases from the first opening to the second opening.

In another embodiment, s process chamber comprises a chamber body; a lid coupled to the chamber body; and a gas flow inlet guide coupled to the lid, the gas flow inlet guide comprising: a flow guide bottom plate comprising a first opening and a second opening, the second opening including a plasma blocker disposed thereover, the flow guide bottom plate having a triangular shape; a top plate disposed over and in contact with the flow guide bottom plate to define a plenum, the top plate having a triangular shape; a flow guide modulator disposed within the plenum between the first opening and the second opening; and a plurality of flow guides disposed within the plenum to direct gases from the first opening to the second opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a chamber having a gas flow inlet guide to uniformly deliver process gas and a gas flow outlet guide to effectively purge process gases and reduce purge time. The chamber includes a chamber body having a lid assembly, a process gas inlet and a process gas outlet configured to be in fluid communication with a processing region in the chamber, a gas flow inlet guide disposed in the process gas inlet, and a gas flow outlet guide disposed in the process gas outlet. The gas flow inlet guide includes a flow modulator and inlet guide channels. The gas flow outlet guide includes outlet guide channels.

Figure 1:
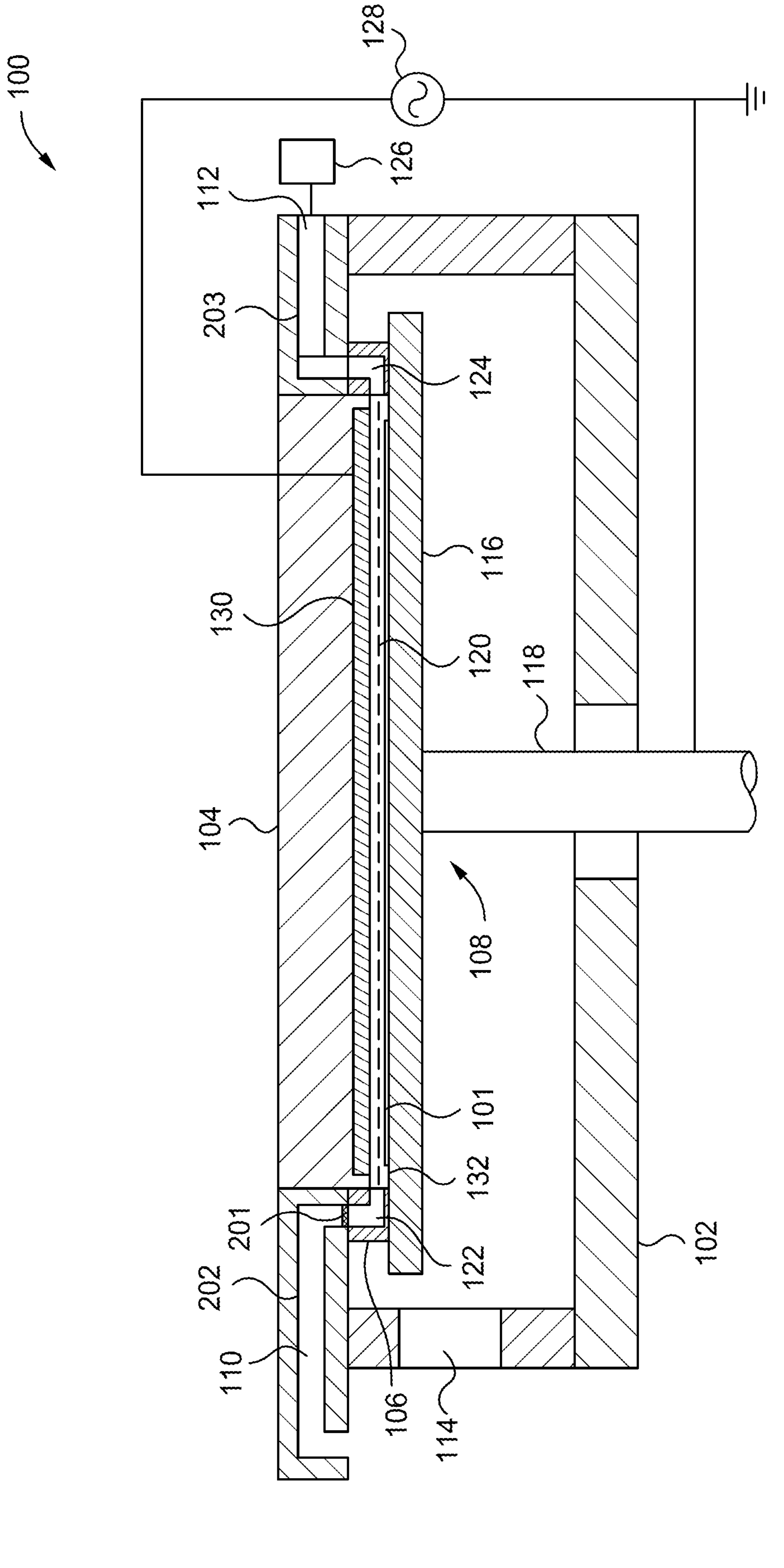
FIG. 1 is a schematic cross-sectional view of an atomic layer deposition chamber according to an embodiment.

FIG. 1 is a schematic cross-sectional view of an ALD chamber 100 according to one embodiment. Suitable ALD chambers may be obtained from Applied Materials, Inc. located in Santa Clara, Calif. It is to be understood that the system described below is an exemplary chamber and other chambers, including chambers from other manufacturers, may be used with or modified to accomplish aspects of the present disclosure. It is contemplated that PECVD chambers may also benefit from aspects of the disclosure. The ALD chamber 100 includes a chamber body 102, a lid assembly 104, a process kit 106, a substrate support assembly 108, a process gas inlet 110, and a process gas outlet 112.

The lid assembly 104 is disposed over the chamber body 102, and the substrate support assembly 108 is at least partially disposed within the chamber body 102. The process kit 106 is coupled to the lid assembly 104. The substrate support assembly 108 includes a pedestal 116 movably disposed in the chamber body 102 by a stem 118. The pedestal 116 includes a substrate support surface 132 configured to support a substrate 101. The stem 118 extends through the chamber body 102 where it is connected to a lift system (not shown) that moves the pedestal 116 between a processing position (as shown) and a transfer position. The transfer position facilitates transfer of the substrate 101 through a slit valve opening 114 formed in a sidewall of the chamber body 102 to provide access to the interior of the ALD chamber 100.

In the processing position, the substrate support assembly 108 contacts the process kit 106 to form a processing region 120 defined by the substrate support surface 132, process kit 106, and lower surface of the lid assembly 104. When the substrate support assembly 108 in the processing position contacts the process kit 106 to form a processing region 120, a gas inlet 122 and a gas outlet 124 of the process kit 106 are coupled to the process gas inlet 110 and the process gas outlet 112, respectively, to form sealed respective gas passages. The process gas inlet 110 and process gas outlet 112 are positioned to be in fluid communication with the processing region 120. In this manner, the process gases are provided to the process gas inlet 110 and to the processing region 120 through the gas inlet 122. The process gas outlet 112 is connected to a pump 126. The process gases flow in the processing region 120 across the substrate 101 and are exhausted through the gas outlet 124 and process gas outlet 112 by the pump 126. An RF (radio frequency) source 128 is coupled to an electrode 130 of the lid assembly 104. The RF source 128 powers the electrode 130 to facilitate generation of plasma from process gases in the processing region 120. The pedestal 116 is grounded or the pedestal 116 may serve as a cathode when connected to the RF source 128 to generate a capacitive electric field between the lower surface of the lid assembly 104 and the pedestal 116 to accelerate plasma species toward the substrate 101.

The particular gas or gases used for ALD and/or PECVD depend upon the process or processes to be performed. In one embodiment, the gases can include trimethylaluminium $(CH_3)_3Al$ (TMA), CpZr, tetrakis ethyl methyl amino zirconium $Zr[N(CH_3)(C_2H_5)]_4$ (TEMAZ), nitrogen ($N_2$), and oxygen ($O_2$), however, the gases are not so limited and may include one or more precursors, reductants, catalysts, carriers, purge gases, cleaning gases (e.g., $BCl_3$), or any mixture or combination thereof. The gases are introduced into the ALD chamber 100 from one side and flow across the substrate 101. For example, gases are flowed through the process gas inlet 110, the gas inlet 122, and across the processing region 120 and are exhausted through the gas outlet 124 and process gas outlet 112.

In an exemplary aluminum oxide ($Al_2O_3$) film forming process, a flow of TMA is delivered to the processing region 120. The TMA flowing across the processing region 120 flows across the substrate 101 and forms a layer of TMA on the substrate 101. A flow of oxygen-containing gas is delivered to the processing region 120. The oxygen-containing gas flowing across the processing region 120 flows across the substrate 101 and is activated into a plasma to provide oxygen radicals for a reaction with the layer of TMA. In one embodiment, the oxygen-containing gas is $O_2$ or ozone ($O_3$). The oxygen radicals react with the layer of TMA on the substrate 101, forming a layer of $Al_2O_3$. Repetition of the flowing TMA, the flowing of the oxygen-containing gas, and the activating the oxygen-containing gas into a plasma to form additional layers on the substrate 101 continues until an $Al_2O_3$ film having a desired thickness is formed.

In an exemplary zirconium dioxide ($ZrO_2$) film forming process, a flow of TEMAZ is delivered to the processing region 120. The TEMAZ flowing across the processing region 120 flows across the substrate 101 and forms a layer of TEMAZ on the substrate 101. A flow of oxygen-containing gas is delivered to the processing region 120. The oxygen-containing gas flowing across the processing region 120 flows across the substrate 101 and is activated into a plasma to provide oxygen radicals for a reaction with the layer of TEMAZ. The oxygen radicals react with the layer of TEMAZ on the substrate 101, forming a layer of $ZrO_2$ on the substrate 101. Repetition of the flowing TEMAZ, the flowing $O_2$, and the activating the oxygen-containing gas into a plasma continues until a $ZrO_2$ film having a desired thickness is formed.

A gas flow inlet guide 202 is provided to uniformly deliver process gas flow and a gas flow outlet guide 203 is provided to effectively and efficiently purge process gases. During processing, parasitic plasma penetrates conventional gas flow inlet guides, such as plasma from a plasma source (not shown) or from the process volume, and causes deposition within the flow guide assembly. The deposition leads to particle generation which causes contamination on substrates, such as glass substrates disposed on the substrate support. However, it has been discovered that plasma penetration to the gas flow inlet guide 202 can be substantially reduced by including a plasma blocker 201 at the interface of an opening of the gas flow inlet guide 202 and the process kit 106. The plasma blocker 201 may include, for example, a mesh material formed of metal or mesh, and allows gas flow therethrough while preventing the penetration of parasitic plasma. Parasitic plasma penetration may be prevented through selection of an appropriately-sized mesh material.

Figure 2:
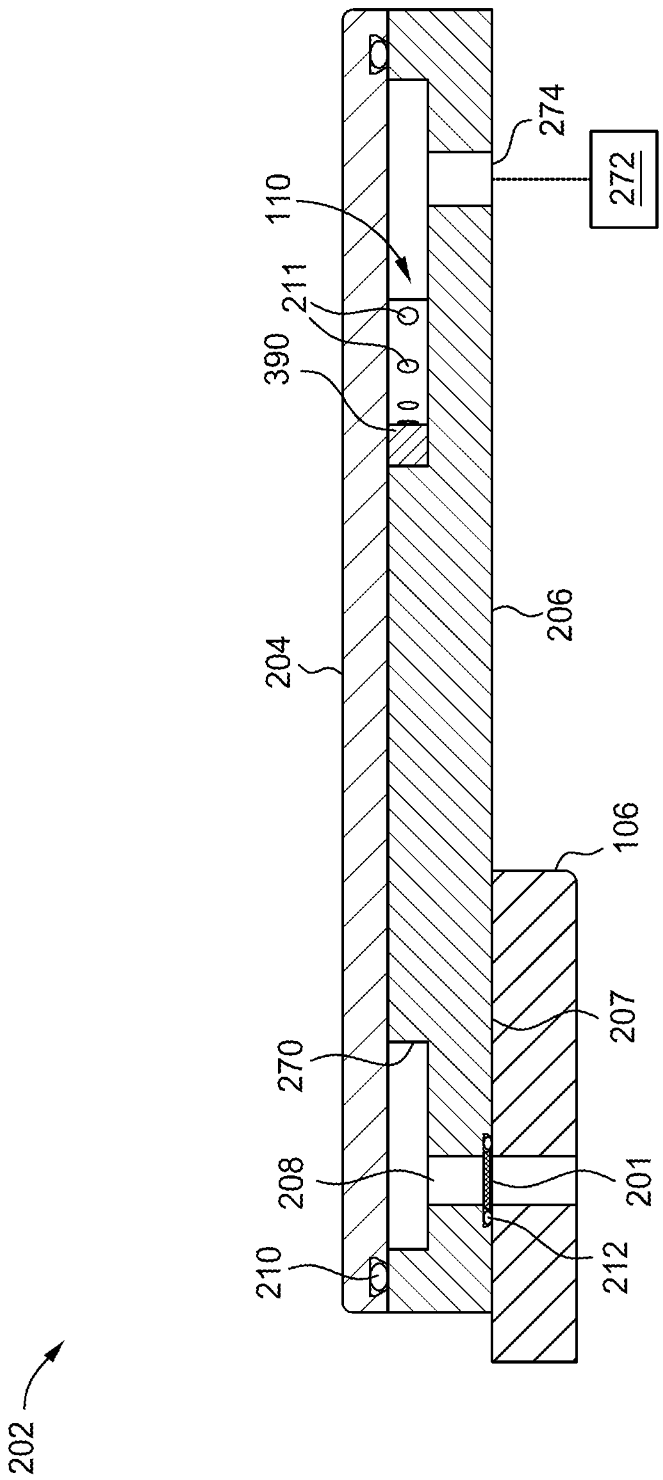
FIG. 2 is a schematic cross sectional side view of the gas flow inlet guide according to an embodiment.

FIG. 2 is a schematic cross sectional side view of the gas flow inlet guide 202. The gas flow inlet guide 202 is formed of a flow guide top plate 204 coupled to a flow guide bottom plate 206. The gas flow inlet guide 202 includes the process gas inlet 110 formed therein. The flow guide top plate 204 forms an airtight seal with the flow guide bottom plate 206, such as with a top plate seal 210, for example, an O-ring, to define the process gas inlet 110. Disposed within the process gas inlet 110 are at least one channel 214 (a plurality are shown in FIG. 3). Each channel 214 is defined between adjacent guides 270, with the flow guides arranged in a non-parallel configuration with respect to one another. The channels 214 facilitate improved gas flow through the process gas inlet 110. Process gas is provided into the process gas inlet 110 via an inlet 274. An optional flow guide modulator 390 (described in further detail with respect to FIG. 3B) facilitates directing and or modulation of gas flow in the channels 214.

The flow guide bottom plate 206 includes an opening 208 in fluid communication with the processing region 120 (shown in FIG. 1). The opening 208 is aligned with an opening of the process kit 106 to facilitate fluid communication with the processing region 120. The flow guide bottom plate 206 forms an airtight seal with the process kit 106, such as with a flow guide body seal 212, e.g., an O-ring. In some embodiments, the process kit 106 is composed of ceramic, such as quartz, silicon carbide, silicon nitride, or another ceramic material.

Process gas from a process gas source 272 flows through the process gas inlet 110 through the at least one channel 214 to the opening 208. A plasma blocker 201 is disposed at an interface 207 of the process kit 106 and the flow guide bottom plate 206. The plasma blocker 201 is coupled to the flow guide bottom plate 206 or the process kit 106. Alternatively, the flow guide bottom plate 206 is clamped between the process kit 106 and the flow guide bottom plate 206 in a groove provided for the flow guide body seal 212. The plasma blocker is a mesh material, such as a metal mesh, which allows gas flow therethrough while preventing parasitic plasma backflow. In one example, the mesh size is selected to mitigate plasma backflow. It is contemplated that various mesh configurations, including sizes and patterns, may facilitate sufficient gas flow while mitigating parasitic plasma backflow. For example, the mesh may be formed by a plurality of metal wires positioned to form square or rectangular openings. In such an example, a width of length of such openings may be 750 mm or less, such as 500 micrometers or less, such as 400 micrometers or less, such as 300 micrometers or less, such as 200 micrometers or less, 150 micrometers or less, such as 100 micrometers or less, such as 50 micrometers or less, such as 40 micrometers or less, such as 30 micrometers or less, such as 20 micrometers or less. As noted above, other sizes are also contemplated.

Figure 3A:
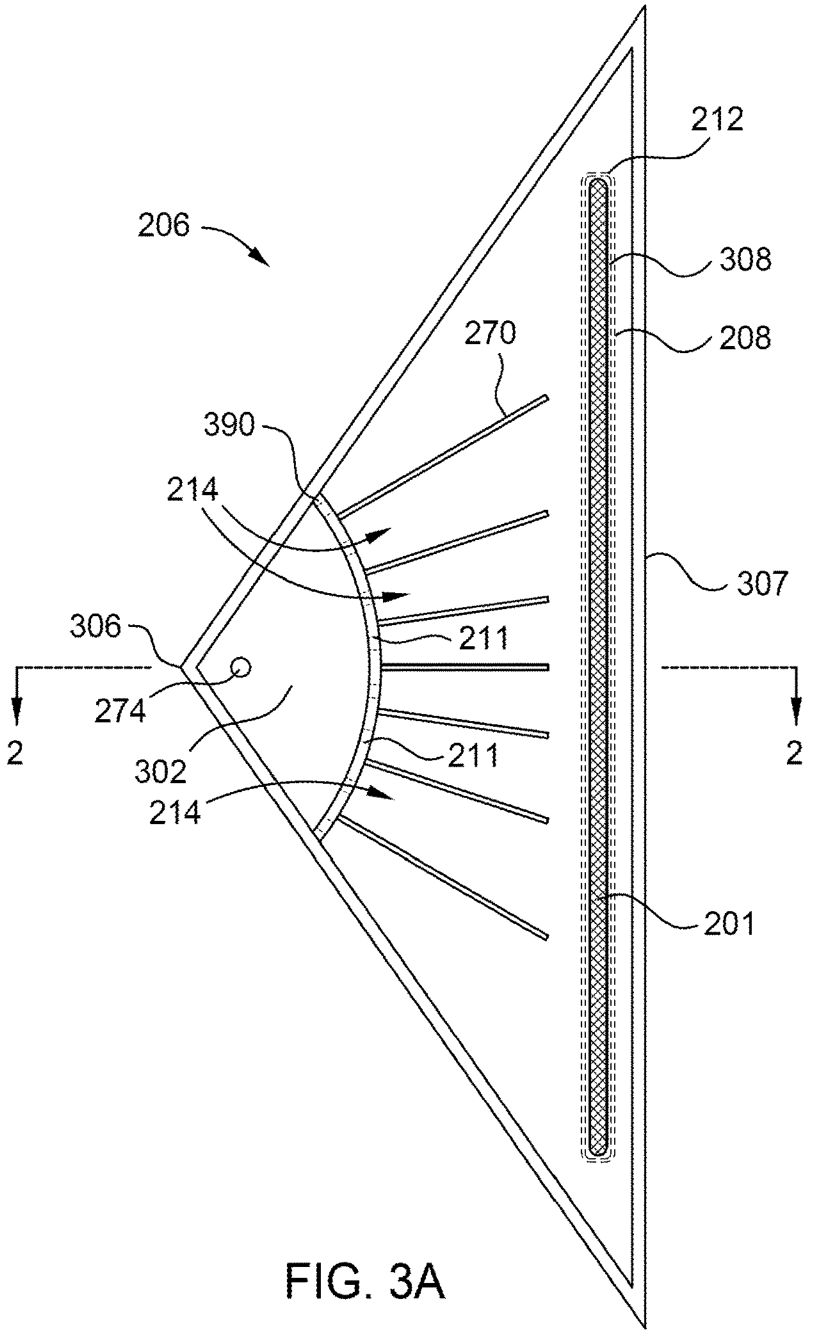
FIG. 3A is a schematic view of the flow guide bottom plate of the gas flow inlet guide according to an embodiment.
Figure 3B:
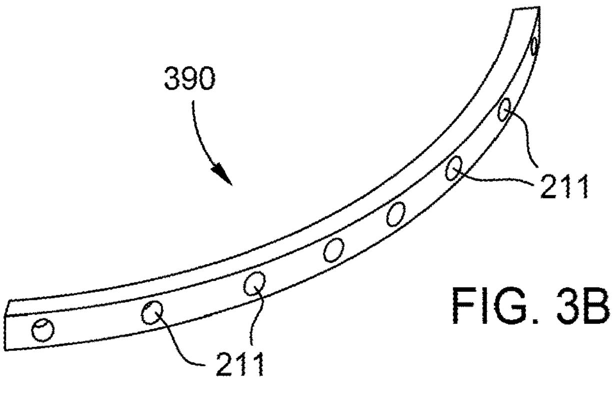
FIG. 3B is a schematic view of a flow modulator according to an embodiment.
Figure 4:
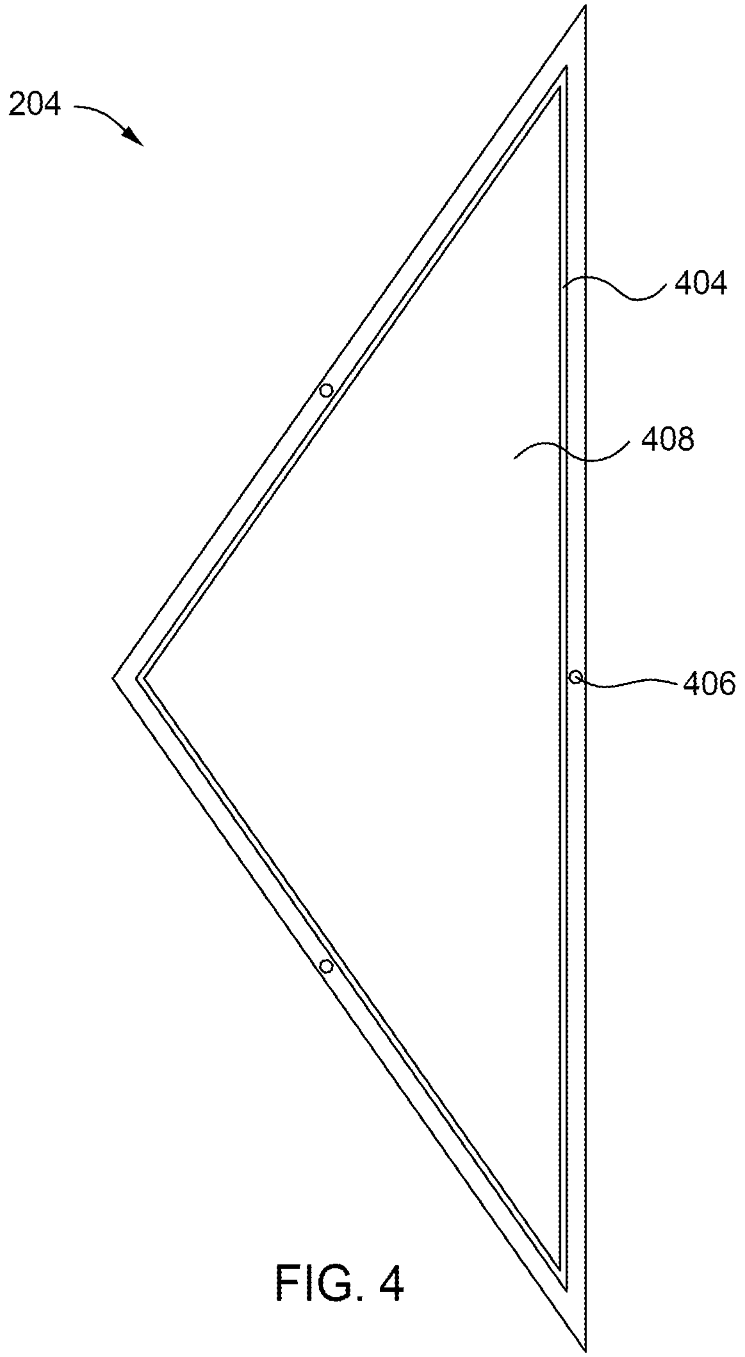
FIG. 4 is a schematic bottom view of the flow guide top plate of the gas flow inlet guide according to an embodiment.

FIG. 3A is a schematic top view of the flow guide bottom plate 206, and FIG. 4 is a schematic bottom view of the flow guide top plate 204. The flow guide bottom plate 206 includes an interface surface configured to at least partially interface the process kit 106. The interface surface is a major surface opposite internal surface 302. The seal 212 (shown in phantom) is disposed in the interface surface. Although the flow guide bottom plate 206 is depicted as a triangle having two sides of equal length, other shapes, including other shapes of triangles are contemplated.

The flow guide bottom plate 206 includes an upstream end 306 and a downstream end 307. The opening 208 is disposed adjacent to the downstream end 307 and is configured to distribute gas therethrough. The plasma blocker 201 is disposed at least partially over the opening 208. As illustrated, the plasma blocker 201 completely covers the opening 208. The plasma blocker 201 is removably coupled to the flow guide bottom plate 206 or clamped between the process kit 106 and the flow guide bottom plate 206. A recess may be formed in the process kit 106 or the flow guide bottom plate 206 for receiving the plasma blocker 201 therein. In some embodiments, the plasma blocker 201 is replaced after a predetermined amount of substrate processing. In some embodiments, the plasma blocker 201 is cleaned using a cleaning chemistry that is compatible with the material of the plasma blocker 201, such as $BCl_3$. In some embodiments, the plasma blocker 201 is replaced after a predetermined number of processes. In some embodiments, the plasma blocker 201 and seal 212 are replaced during maintenance.

A plurality of channels 214 are formed between adjacent guides 270. The guides 270 are angularly spaced from one another and direct gas towards the plasma blocker 201. The guides 270 extend from an optional gas flow modulator 390 for a predetermined distance. It is contemplated that the guides 270 may extend to the plasma blocker 201, or may extend short thereof (as shown). It is further contemplated that the length, width, angular spacing, and quantity of guides 270 may adjusted to influence gas flow according to process specifications.

In one example, the plasma blocker has a length that is at least twice as great as a width, such as at least 5 times as great, such as at least 10 times as great, such as at least 20 times as great. In one examples, the length of the plasma blocker 201 is greater than a maximum width of the widest points of the outermost flow guides 270. Other dimensions and configurations are also contemplated.

FIG. 3B is a schematic view of an optional gas flow modulator 390. The gas flow modulator 390 may be coupled to the flow guide bottom plate 206 to facilitate directing of gas flow within the gas flow inlet guide 202. The gas flow modulator includes a plurality of openings 291 (one is labeled) for directing gas into channels 214. In one example, each opening 291 corresponds to a single channel 214, although other configurations are contemplated. The size (e.g., diameter), direction, position, and/or number of openings can be adjusted to direct flow through the channels 214 in a predetermined manner, in order to adjust process uniformity (e.g., deposition uniformity). The gas flow modulator 390 is arcuate in shape (although other shapes are contemplated). The ends of the gas flow modulator 390 abut adjacent sidewalls of the flow guide bottom plate 206.

Referring to FIG. 4, a bottom view of the flow guide top plate 204 is shown having a recessed portion 404 surrounding a surface 408. The recessed portion 404 is a groove configured to support a seal therein. For example, the recessed portion 404 may be a dovetail groove for the top plate seal 210 (shown in FIG. 2). The surface 408 is configured to at least partially interface the flow guide bottom plate 206 to define a plenum (e.g., process gas inlet 110) therein.

The flow guide top plate 204 is coupled to the flow guide bottom plate 206 using fasteners 406 (three are shown, but more are contemplated). Although the flow guide top plate 204 is depicted as a triangle, other shapes are also contemplated. Additionally, although the recessed portion 404 is depicted as a triangle, other shapes are also contemplated, such as a triangle with one or more rounded vertices. The flow guide top plate 204 is a planar member, having planar opposing major surfaces, with the exception of the presence of the recessed portion 404.

It has been discovered that the plasma blocker 201 (shown in FIG. 1) inhibits deposition of material within the surfaces forming the volume of the gas flow inlet guide 202, such as the surface 408. The plasma blocker 201 is composed of metal, such as stainless steel, aluminum, nickel, alloys thereof, or combinations thereof. The plasma blocker 201 is a mesh having mesh opening size that is determined based on a Debye length ($\lambda_D$) of one or more plasmas used in processing. The plasma blocker includes one or more mesh openings sized based one or more plasma properties such as a plasma density, an electron temperature, or an ion temperature. In some embodiments, the mesh openings are sized based on a characteristic of a process gas, such as gas atom or gas molecule size. As used herein, a mesh opening size refers to a length or diameter, such as an average length or diameter, of an aperture of the mesh. The mesh can be composed of a first set of wires arranged in a planar surface, each of adjacent wire of the first set of wires substantially parallel from one another and a second set of wires arranged over the first the set of wires, each adjacent wire of the second set of wires are substantially parallel from one another. The first set of wires are angled offset with respect to the second set of wires, such as in a perpendicular arrangement. A mesh opening can be a distance between adjacent wires in the first or second set of wires, or can be a distance between adjacent wire intersections. Other mesh textures and arrangements are also contemplated.

The Debye length is determined using Equation (1) below.

$$\lambda_D = \sqrt{\frac{\varepsilon_0 k_B / q_e^2}{n_e/T_e + \sum_j z_j^2 n_j / T_i}} \qquad \text{Equation (1)}$$

where $\lambda_D$ is the Debye length, $\varepsilon_0$ is the free space permittivity, $k_B$ is the Boltzmann constant, $q_e$ is electron charge, $T_e$ is electron temperature, $T_i$ is ion temperature, and $n_e$ is the density of electrons, and $n_j$ is the density of atomic species j, with positive ionic charge $z_j q_e$.

In some embodiments, the Debye length is determined using Equation (2) below, such as when ion mobility is negligible.

$$\lambda_D = \sqrt{\frac{\varepsilon k_B T_e}{nq^2}} \quad \text{Equation (2)}$$

where $\lambda_D$ is the Debye length, $\varepsilon_0$ is the free space permittivity, $k_B$ is the Boltzmann constant, q is electron charge, $T_e$ is electron temperature, and n is the density of electrons.

The mesh opening size can be a factor of Debye length which can be represented by Equation (3) below.

Mesh Opening=$C\times\lambda_D$, where $C$ is greater 0. Equation (3)

C values of about 0 to about 1 or less correspond to very good shielding, however, can at least partially or fully block process gas flow as well as plasma. In some embodiments, C values of about 1 or greater, such as about 1 to about 10, such as about 2 to about 5 provides good plasma shielding while allowing process gas to flow therethrough.

Figure 5:
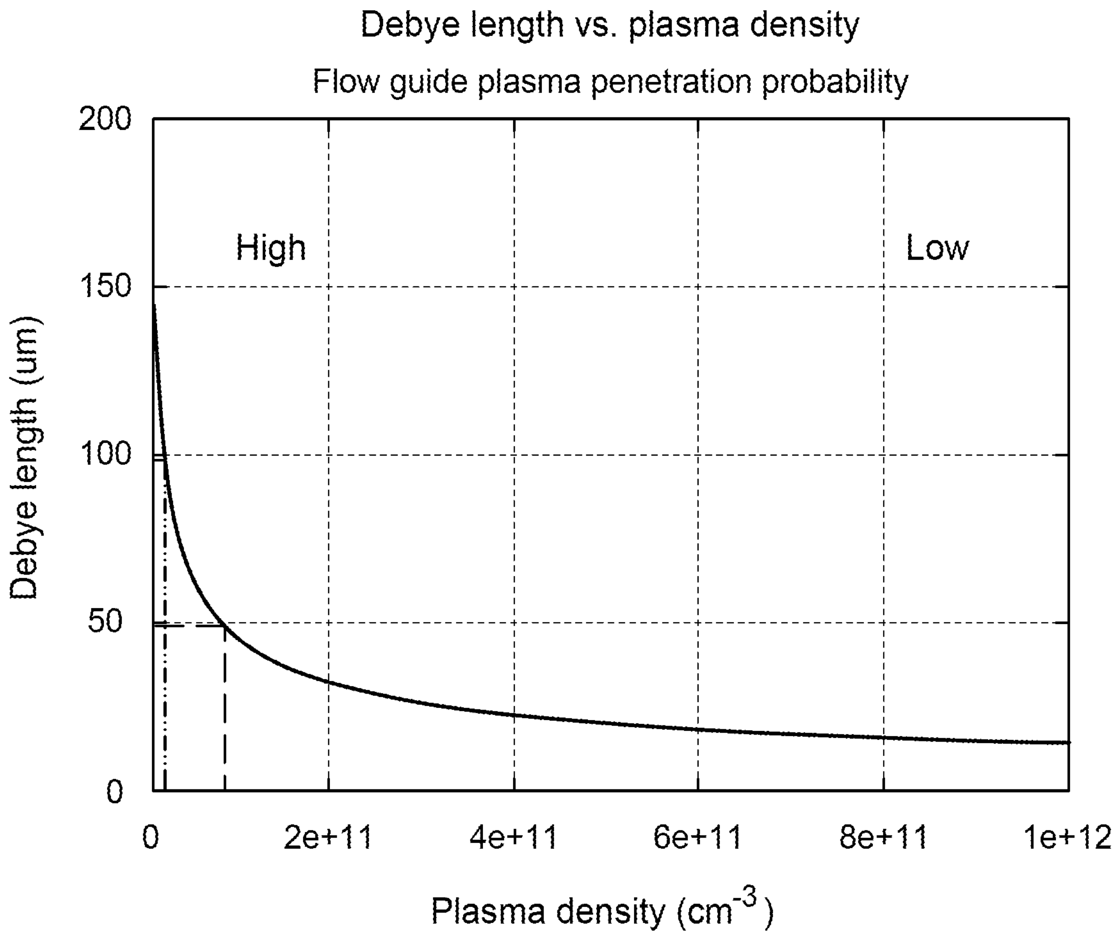
FIG. 5 depicts an example Debye length curve to determine mesh opening size of a plasma blocker according to an embodiment.

FIG. 5 depicts a curve generated from CCP parameters associating various plasma densities with corresponding Debye lengths used to determine mesh opening size. The electron density for the plasma is about $1\times10^{10}$ $cm^{-3}$ to about $10\times10^{10}$ $cm^{-3}$ for an example process and the electron temperature is about 1 to about 4 eV. Electron density of the plasma can be about $3\times10^{10}$ $cm^{-3}$ to about $5\times10^{10}$ $cm^{-3}$, or $7\times10^{10}$ $cm^{-3}$ to about $9\times10^{10}$ $cm^{-3}$. The mesh opening size is selected to be about 50 μm to about 100 μm. The mesh opening size is selected to prevent plasma penetration in the high probability regime while allowing process gases to pass through the mesh and into the process volume. Other electron densities and mesh opening sizes are also contemplated depending on the plasma. It has been discovered that selecting a mesh opening size that is too small can affect the process. For example, selecting a mesh opening size that is too small can change the chemistry of the gas flowing in to the process chamber, by blocking at least some of the gas molecules needed for the process. Additionally selecting a mesh opening size that is too large is ineffective for reducing parasitic plasma entering the gas flow inlet guide 202.

Although the plasma blocker 201 is described with reference to an ALD chamber, other chambers that use plasma are also contemplated such as PECVD chambers. Plasma blockers 201 formed of mesh can be used to allow gas to flow therethrough while blocking parasitic plasma by sizing the mesh opening size based on the plasma process characteristics, such as plasma density, such as electron temperature.

While the foregoing is directed to examples of the present disclosure, other and further examples of the disclosure may be devised without departing from the basic scope thereof, and the scope thereof is determined by the claims that follow.

What is claimed is:

1. A gas flow inlet guide, comprising:

a flow guide bottom plate comprising a first opening and a second opening, the second opening including a plasma blocker disposed thereover, wherein the plasma blocker is a metal mesh with an aperture size of about 50 μm to about 100 μm;

a top plate disposed over and in contact with the flow guide bottom plate to define a plenum; and a plurality of flow guides disposed within the plenum to direct gases from the first opening to the second opening.

2. The gas flow inlet guide of claim 1, wherein the metal mesh comprises stainless steel, aluminum, nickel, alloys thereof, or combinations thereof.

3. The gas flow inlet guide of claim 1, wherein the metal mesh comprises stainless steel.

4. The gas flow inlet guide of claim 1 wherein the metal mesh comprises aluminum.

5. The gas flow inlet guide of claim 1, wherein the plasma blocker is disposed in a recess formed in a surface of the flow guide bottom plate.

6. A gas flow inlet guide, comprising:

a flow guide bottom plate comprising a first opening and a second opening, the second opening including a plasma blocker disposed thereover, wherein the plasma blocker is a metal mesh with an aperture size of about 50 μm to about 100 μm;

a top plate disposed over and in contact with the flow guide bottom plate to define a plenum;

a flow guide modulator disposed within the plenum between the first opening and the second opening; and a plurality of flow guides disposed within the plenum to direct gases from the first opening to the second opening.

7. The gas flow inlet guide of claim 6, wherein the metal mesh comprises stainless steel, aluminum, nickel, alloys thereof, or combinations thereof.

8. The gas flow inlet guide of claim 7, wherein the flow guide modulator comprises a plurality of openings formed therethrough, and each opening is aligned with a channel defined by adjacent flow guides.

9. The gas flow inlet guide of claim 8, wherein the flow guides are non-parallel to one another.

10. The gas flow inlet guide of claim 9, wherein each respective flow guide of the flow guides has a length, and the length of laterally-outward flow guides is greater than length of inwardly-positioned flow guides.

11. A process chamber, comprising:

a chamber body;

a lid coupled to the chamber body; and a gas flow inlet guide coupled to the lid, the gas flow inlet guide comprising:

a flow guide bottom plate comprising a first opening and a second opening, the second opening including a plasma blocker disposed thereover, wherein the plasma blocker is a metal mesh with an aperture size of about 50 μm to about 100 μm, the flow guide bottom plate having a triangular shape;

a top plate disposed over and in contact with the flow guide bottom plate to define a plenum, the top plate having a triangular shape;

a flow guide modulator disposed within the plenum between the first opening and the second opening; and a plurality of flow guides disposed within the plenum to direct gases from the first opening to the second opening.

12. The process chamber of claim 11, further processing a process kit that engages the flow guide bottom plate.

13. The process chamber of claim 7, wherein the metal mesh comprises stainless steel, aluminum, nickel, alloys thereof, or combinations thereof.

14. The process chamber of claim 13, wherein the flow guide modulator comprises a plurality of openings formed therethrough, and each opening is aligned with a channel defined by adjacent flow guides.

* * * * *